US012610521B2

(12) United States Patent
Yu et al.

(10) Patent No.: US 12,610,521 B2
(45) Date of Patent: Apr. 21, 2026

(54) SEMICONDUCTOR MEMORY HAVING DISCRETE ACTIVE REGIONS AND METHOD OF MAKING THE SAME

(71) Applicant: ChangXin Memory Technologies, Inc., Hefei City (CN)

(72) Inventors: Yexiao Yu, Hefei City (CN); Zhongming Liu, Hefei City (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 841 days.

(21) Appl. No.: 17/915,908

(22) PCT Filed: Jul. 29, 2022

(86) PCT No.: PCT/CN2022/108778
§ 371 (c)(1),
(2) Date: Sep. 29, 2022

(87) PCT Pub. No.: WO2024/016374
PCT Pub. Date: Jan. 25, 2024

(65) Prior Publication Data
US 2024/0224497 A1    Jul. 4, 2024

(30) Foreign Application Priority Data
Jul. 18, 2022    (CN) .......................... 202210843271.8

(51) Int. Cl.
*H10B 12/00*         (2023.01)
(52) U.S. Cl.
CPC ............. *H10B 12/30* (2023.02); *H10B 12/02* (2023.02)

(58) Field of Classification Search
CPC ................................. H10B 12/30; H10B 12/02
(Continued)

(56) References Cited

U.S. PATENT DOCUMENTS

| | | | |
|---|---|---|---|
| 2009/0124097 A1* | 5/2009 | Cheng ................. | H01L 21/3088 438/778 |
| 2013/0161832 A1* | 6/2013 | Cho ..................... | H10D 30/025 257/E21.59 |

(Continued)

FOREIGN PATENT DOCUMENTS

| | | | |
|---|---|---|---|
| CN | 112151360 | * | 12/2020 |
| CN | 112768352 A | | 5/2021 |
| CN | 114093820 A | | 2/2022 |

*Primary Examiner* — Sheng-Bai Zhu
(74) *Attorney, Agent, or Firm* — Kilpatrick Townsend & Stockton LLP

(57) ABSTRACT

The present application provides a method for fabricating a semiconductor memory structure. The method includes: providing a substrate; forming a stack layer on the substrate, and arranging spacer rows in the stack layer, forming a plurality of active lines, and forming a plurality of transfer pillars in the stack layer; forming a spacer structure outside the transfer pillars, and forming an etching hole; etching the second composite mask layer and the initial semiconductor along the etching hole layer of the active lines to form a plurality of discrete active region masks; and etching the substrate along the active region masks to form a plurality of discrete active regions. The disclosed technique can effectively reduce the preparation difficulty of the active area, improve the LCDU of the active area, and improve the performance of the semiconductor structure.

17 Claims, 26 Drawing Sheets

(58) Field of Classification Search
    USPC ........................................................ 257/295
    See application file for complete search history.

(56)                      References Cited

U.S. PATENT DOCUMENTS

| 2013/0234301 A1* | 9/2013 | Wang ................ H01L 21/28123 |
| | | 257/E21.258 |
| 2014/0138800 A1* | 5/2014 | He ...................... H01L 21/0337 |
| | | 257/632 |
| 2014/0175555 A1* | 6/2014 | Lee ................... H01L 21/76224 |
| | | 438/424 |

* cited by examiner

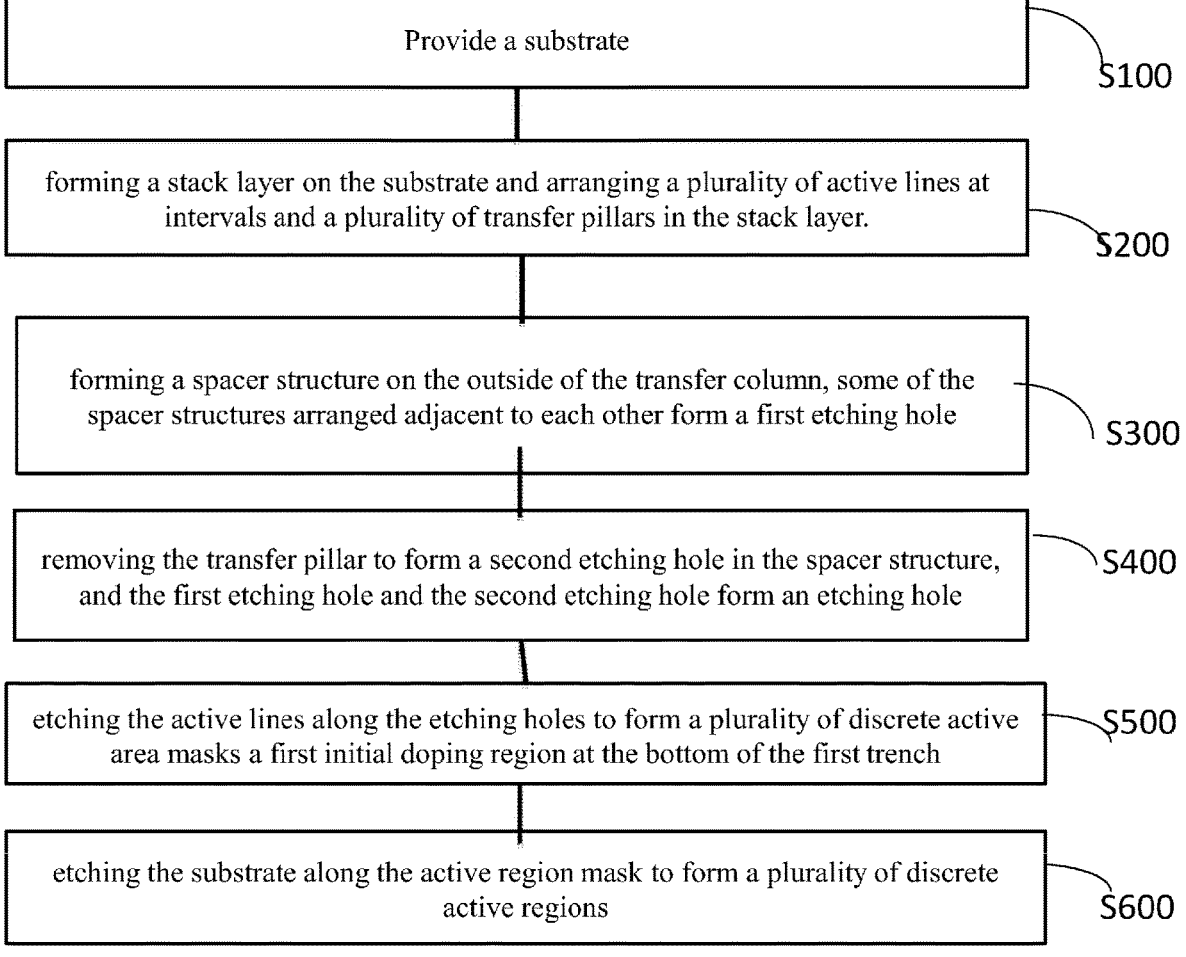

Provide a substrate

S100 forming a stack layer on the substrate and arranging a plurality of active lines at intervals and a plurality of transfer pillars in the stack layer.

S200 forming a spacer structure on the outside of the transfer column, some of the spacer structures arranged adjacent to each other form a first etching hole

S300 removing the transfer pillar to form a second etching hole in the spacer structure, and the first etching hole and the second etching hole form an etching hole

S400 etching the active lines along the etching holes to form a plurality of discrete active area masks a first initial doping region at the bottom of the first trench

S500 etching the substrate along the active region mask to form a plurality of discrete active regions

SEMICONDUCTOR MEMORY HAVING DISCRETE ACTIVE REGIONS AND METHOD OF MAKING THE SAME

CROSS REFERENCES TO RELATED APPLICATIONS

This application claims the benefit of priority of Chinese patent application with the application number 202210843271.8, entitled "Semiconductor Memory And Method of Making The Same", filed with the China National Intellectual Property Administration on Jul. 18, 2022, the contents of which are incorporated herein by reference in its entirety.

TECHNICAL FIELD

The present application relates to the technical field of semiconductor manufacturing, and in particular, to a method for fabricating a semiconductor structure, a semiconductor structure and a memory.

BACKGROUND

Dynamic Random Access Memory (DRAM for short) is a semiconductor memory that writes and reads data at high speed and randomly, and is widely used in data storage devices or equipment.

A DRAM includes a plurality of repeating memory cells disposed on a substrate, each memory cell including a capacitor and a transistor. An active layer is provided on the substrate, the active layer includes a plurality of active regions arranged in an array, and each of the active region includes a channel region, a source region connected to the source of the transistor, and a drain region connected the drain of the transistor, and the channel region is located between the source region and the drain region. When a conducting signal is input to the gate of the transistor, the channel region conducts the source region and the drain region to complete the conduction process of the transistor.

However, as the feature size of DRAM continues to decrease, the manufacturing difficulty of the active area increases, and its local critical dimension uniformity (LCDU for short) decreases, which affects the performance of DRAM.

SUMMARY

The present application provides a method for fabricating a semiconductor memory structure, which can effectively reduce the difficulty of fabricating an active region, improve the LCDU in the active region, and improve the performance of the semiconductor structure.

A first embodiment of the present application provides a method for fabricating a semiconductor structure, comprising:

provide a substrate;

forming a stack layer on the substrate, arranging a plurality of active lines at intervals in the stack layer, and forming a plurality of transfer pillars in the stack layer;

forming spacer structures outside the plurality of transfer pillars, wherein at least some of the adjacent spacer structures are arranged to be a first etch hole;

removing the transfer pillar to form a second etch hole in one of the spacer structures, wherein the first etch hole and the second etch hole form an etching hole;

etching active lines along the etch holes to form a plurality of discrete active region masks; and etching the substrate along the active region mask to form a plurality of discrete active regions.

In a second embodiment, the present application provides a semiconductor structure including an active region, wherein the active region is fabricated by the above-mentioned method.

In a third embodiment, the present application provides a memory including the above-mentioned semiconductor structure.

In the method for fabricating a semiconductor memory structure provided by the present application by performing two mask etching processes on the first compound mask layer of the substrate, the size of the transfer pillar for forming one of the spacer structures can be reduced, to improve mask accuracy. By forming a spacer structure on the outside of the transfer column, one of the spacer structures s arranged adjacent to each other form a first etch hole, a second etch hole is formed in one of the spacer structures, and the first etch hole and the second etch hole are used for etching active lines, forming active area masks. In this way, the diffraction effect of light can be effectively avoided, resulting in low imaging resolution of the mask, which affects the precision of the etching process. Therefore, the use of the above active region mask to etch the substrate to form discrete active regions can avoid the problem of poor etching accuracy caused by unclear mask imaging in the related art. The preparation difficulty of the source region improves the LCDU of the active region and optimizes the performance of the semiconductor structure.

The detailed structural scopes of the present application and its other inventive features and beneficial effects will be more clearly understood by the description of the preferred embodiments in conjunction with the accompanying drawings.

BRIEF DESCRIPTION OF THE DRAWINGS

FIG. 1 is a schematic flowchart of a method for fabricating the semiconductor structure provided by an embodiment of the present application;

DETAILED DESCRIPTION OF THE PREFERRED EMBODIMENTS

Figure 2:
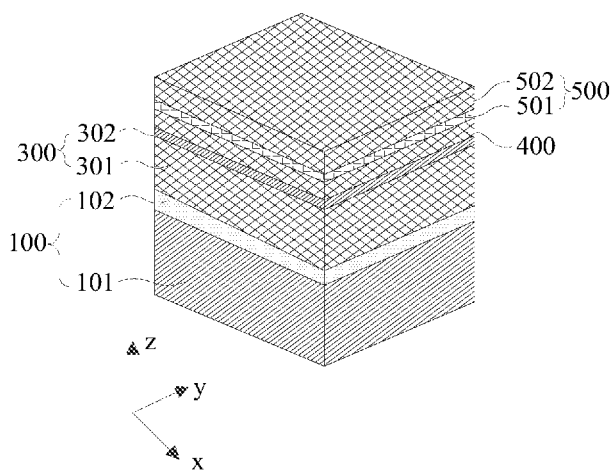
FIG. 2 is a schematic view of a film layer on a substrate according to the method for fabricating the semiconductor structure provided by an embodiment of the present application.

Process of research and development has revealed that an active layer of a DRAM device included discrete active regions arranged in an array, and one of the active regions includes a channel region and a source region which is connected to the source of a transistor, and a drain region which is connected to the drain of the transistor, and the channel region is located between the source region and the drain region. When a conduction signal is input to the gate of the transistor, the channel region conducts the source region and the drain region to complete the conduction process of the transistor. According to the current technique, in the final cross sections (AA cut final profile) of the active region, a three-time photo-etching method (litho-etch-litho-etch-litho-etch, abbreviated as LELELE) forms a plurality of discrete and arrayed active regions. During the three-time photo-etching process, three masks are formed, and the patterns on the masks are transferred to the to-be-patterned area at the exposure process. On the etched substrate, an active region is formed in the substrate.

However, as the feature sizes of DRAMs continue to decrease, especially during the fabrication of DRAMs with feature sizes smaller than 15 nm, the pattern sizes on the photomasks also continue to decrease. When the light passes through the above-mentioned patterns, diffraction will occur, resulting in the reduction of the imaging fidelity of the mask patterns on the substrate to be etched. In this way, not only the precision of the etched patterns of the substrate is reduced, but also the LCDU of the active area is reduced, and the preparation difficulty of the active area is also increased. When the LCDU of the active area is reduced, when a DRAM memory cell is prepared on the substrate, the capacitance or transistor in the memory cell has poor correspondence with the active area of the substrate, resulting in the substrate and the capacitance, or the substrate and the substrate. The electrical connection of the transistors is ineffective, which affects the structural stability and storage performance of the DRAM.

In view of this, the method for fabricating a semiconductor structure, the semiconductor structure and the memory provided by the embodiments of the present application are performed by performing two mask etching processes on the first composite mask layer of the substrate (Litho-etch-litho-etch, abbreviated as LELE), can reduce the size of the transfer pillars used to form one of the spacer structures and improve the mask precision. By forming a spacer structure on the outside of the transfer column, one of the spacer structures s arranged adjacent to each other form a first etch hole, a second etch hole is formed in one of the spacer structures, and the first etch hole and the second etch hole are used for etching Active lines, forming active area masks. In this way, the diffraction effect of light can be effectively avoided, resulting in low imaging resolution of the mask, which affects the precision of the etching process. Therefore, the use of the above active region mask to etch the substrate to form discrete active regions can avoid the problem of poor etching accuracy caused by unclear mask imaging in the related art. The preparation difficulty of the source region improves the LCDU of the active region and optimizes the performance of the semiconductor structure.

In order to make the objectives, technical solutions and advantages of the present application clearer, the technical solutions in the embodiments of the present application will be described in more detail below with reference to the accompanying drawings in the preferred embodiments of the present application. Throughout the drawings, the same or similar reference numbers refer to the same or similar parts or parts having the same or similar functions. The described embodiments are some, but not all, of the embodiments of the present application. The embodiments described below with reference to the accompanying drawings are exemplary, and are intended to be used to explain the present application, but should not be construed as a limitation to the present application. Based on the embodiments in the present application, all other embodiments obtained by those of ordinary skill in the art without creative work fall within the protection scope of the present application. The embodiments of the present application will be described in detail below with reference to the accompanying drawings.

In a first embodiment, an embodiment of the present application provides a method for fabricating a semiconductor structure. The fabrication method is mainly used for fabricating a semiconductor structure. The semiconductor structure includes an active region, and the active region can be fabricated by the aforementioned fabrication method.

Figure 22:
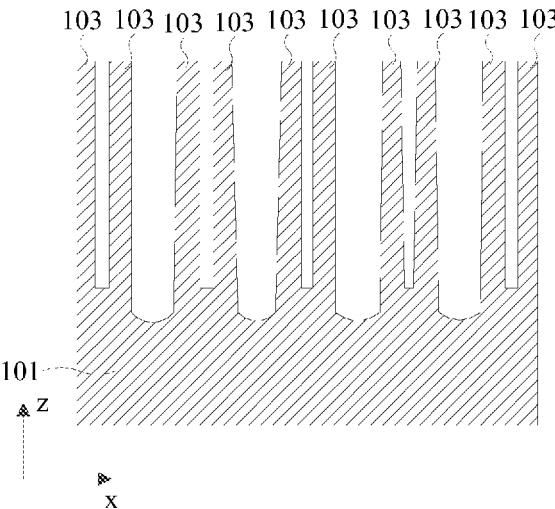
FIG. 22 is a cross-sectional view of an active region according to the method for fabricating the semiconductor structure provided by an embodiment of the present application.

FIG. 22 is a cross-sectional view of an active region according to the method for fabricating the semiconductor structure. Referring to FIG. 22, the semiconductor structure may be a substrate 100, and there are multiple active regions 103 in the substrate 100, a plurality of active regions 103 are separated and arranged in an array in the substrate 100. An isolation structure (not shown in the figure) may be provided between adjacent active regions 103, and the isolation structure may be made of insulating materials, including but not limited to silicon oxide, germanium oxide, and silicon germanium oxide, and the isolation structure can be effective. The electron transmission between two adjacent active regions 103 is blocked, signal interference is reduced, and the stability of the electrical signal in each active region 103 is ensured, thereby improving the stability of the semiconductor structure.

FIG. 1 is a schematic flowchart of a method for fabricating the semiconductor structure provided by an embodiment of the present application. Referring to FIG. 1, the method includes:

S100: provide a substrate. The substrate 100 provides a structural basis for subsequent structures and processes, and the material of the substrate 100 may include any one or more of silicon, germanium, silicon germanium, silicon carbide, a silicon-on-insulator substrate, and a germanium-on-insulator substrate. In this embodiment, at least part of the substrate 100 is a silicon substrate, and the silicon material may be single crystal silicon. The substrate 100 may be prepared by chemical vapor deposition (CVD for short).

S200: forming a stack layer on the substrate and arranging a plurality of active lines at intervals and a plurality of transfer pillars in the stack layer.

Herein, the stacked layer includes an initial semiconductor layer, a second composite mask layer, an intermediate mask layer and a first composite mask layer which are stacked in sequence. Based on this, S200 can include steps of:

Forming an initial semiconductor layer, a second composite mask layer, an intermediate mask layer and a first composite mask layer are sequentially formed on the substrate, and the initial semiconductor layer includes a plurality of active lines arranged at intervals.

A mask etching process is performed twice on the first composite mask layer to form a plurality of initial pillars arranged in an array in the first composite mask layer.

The mask is etched along the initial pillars to form a plurality of transfer pillars in an array in the mask.

Figure 10:
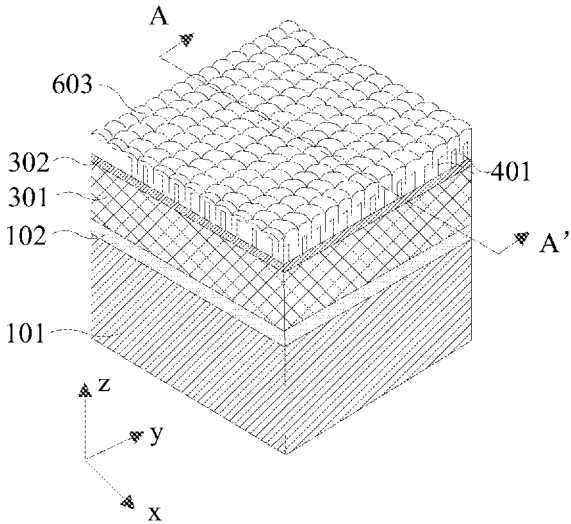
FIG. 10 is a schematic view of an initial spacer structure according to the method for fabricating the semiconductor structure provided by an embodiment of the present application.
Figure 11:
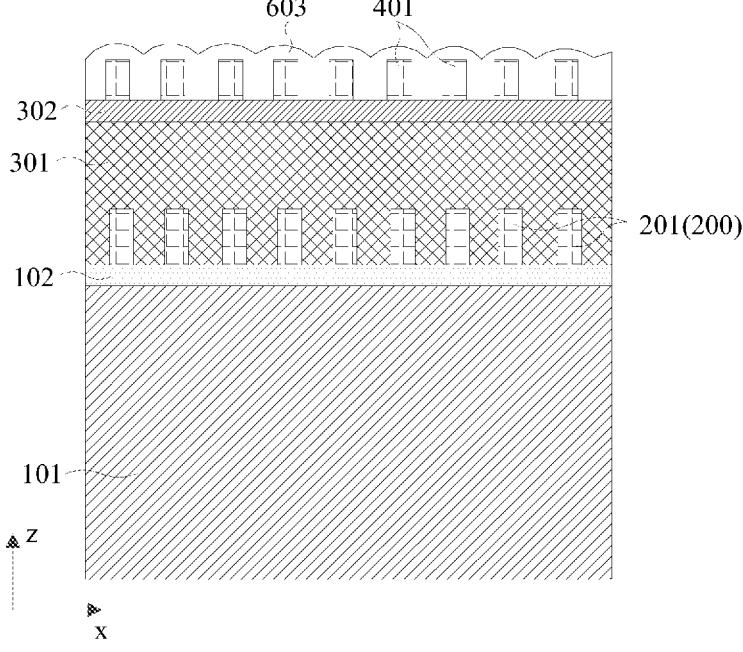
FIG. 11 is a cross-sectional view at A-A' in FIG. 10.

An initial semiconductor layer, a second composite mask layer, an intermediate mask layer and a first composite mask layer are sequentially formed on the substrate, and the initial semiconductor layer includes a plurality of active lines arranged at intervals. FIG. 2 is a schematic view of a film layer on a substrate according to the method for fabricating the semiconductor structure provided by an embodiment of the present application, and FIG. 11 is a cross-sectional view at A-A' in FIG. 10. Referring to FIGS. 2 and 11, the film layers on the substrate 100 may include a stacked initial semiconductor layer 200 (shown in FIG. 11), a second composite mask layer 300, an intermediate mask layer 400 and a first semiconductor layer 200, which are sequentially formed. A composite mask layer 500, the above-mentioned film layers can be prepared by CVD. A plurality of active lines 201 are arranged in the initial semiconductor layer 200 at intervals, and the material of the active lines 201 may be polysilicon.

Figure 23:
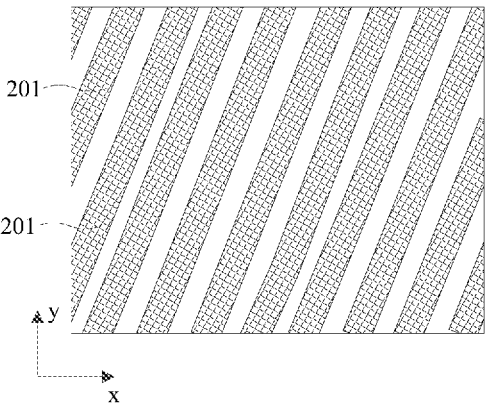
FIG. 23 is a schematic view of an active line of the semiconductor structure provided by an embodiment of the present application.

FIG. 23 is a schematic view of an active line of the semiconductor structure provided by an embodiment of the present application. With reference to FIG. 23, the active lines 201 may be arranged on the substrate 100 at intervals along a predetermined direction, and the predetermined direction may be parallel Any direction within the plane of the substrate 100 is not limited in this embodiment.

Figure 3:
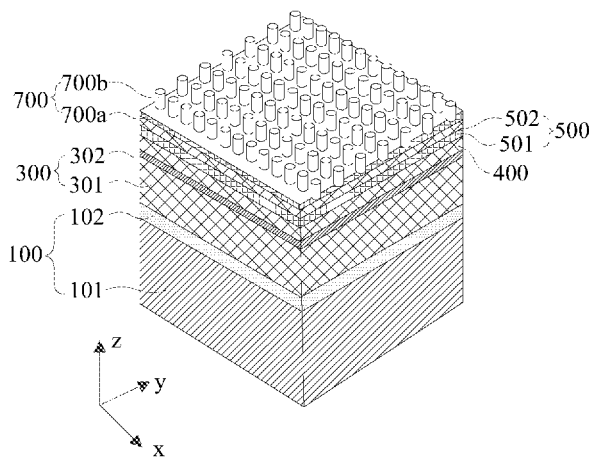
FIG. 3 is a schematic view of a first initial mask layer according to the method for fabricating the semiconductor structure provided by an embodiment of the present application.

Specifically, the mask etching process is performed twice on the first composite mask layer to form a plurality of initial pillars arranged in an array in the first composite mask layer. The present application adopts two mask etching processes, which can effectively improve the etching precision, and at the same time, can avoid more mask etchings, reduce the difficulty of fabricating the semiconductor structure, and improve the preparation efficiency. The two mask etching processes on the first composite mask layer 500 specifically include:

Wherein, the first initial mask layer 700 is formed on the first composite mask layer 500. FIG. 3 is a schematic view of a first initial mask layer according to the method for fabricating the semiconductor structure provided by an embodiment of the present application. Referring to FIGS. 2 and 3, the first composite mask layer 500 includes a first hard mask layer 502 and a The first filling mask layer 501 and the first hard mask layer 502 are located on the side of the first filling mask layer 501 away from the substrate 100. The first hard mask layer 502 may be a spin on hard mask (SOH for short), and the material thereof may be a silicon-rich compound. The material of the first filling mask layer 501 includes oxygen-rich silicon oxynitride (oxygen-rich SiON).

Specifically, forming the first initial mask layer 700 on the first composite mask layer 500 includes: forming the first initial mask layer 700 on the first hard mask layer 502.

The first initial mask layer 700 includes a first initial mask base layer 700a and a first initial mask pattern layer 700b, and the first initial mask pattern layer 700b is located on the side of the first initial mask base layer 700a away from the substrate 100, the first initial mask pattern layer 700b has a plurality of first mask patterns corresponding to the plurality of first initial pillars 503a one-to-one. The first mask pattern may be a pillar with the same shape as the first initial pillar 503a, and the pillar size of the first mask pattern is the same as that of the first initial pillar 503a. There are multiple first mask patterns, and the multiple first mask patterns are arranged in an array on the first initial mask base layer 700a. Of course, the arrangement of the first mask pattern is not limited to this, and it can be ensured that it is the same as the first initial pillars 503a to be formed subsequently.

Specifically, forming the first initial mask layer 700 on the first hard mask layer 502 may include: forming a first initial mask base layer 700a on the first hard mask layer 502, and forming a first initial mask base layer 700a on the first initial mask base layer 700a A first initial mask pattern layer 700b is formed. Both the first initial mask base layer 700a and the first initial mask pattern layer 700b may be formed by CVD or atomic layer deposition (ALD for short). The material of the first initial mask base layer 700a can be silicon oxynitride, the first initial mask pattern layer 700b can be photoresist, and the material can be an organic compound sensitive to light (e.g., ultraviolet light), such as polyvinyl alcohol cinnamate.

Figure 4:
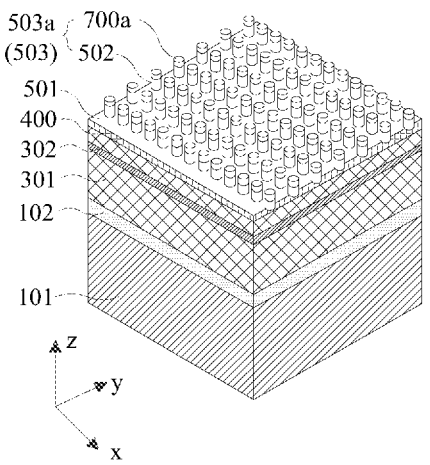
FIG. 4 is a schematic view of a first initial pillars according to the method for fabricating the semiconductor structure provided by an embodiment of the present application.

The first composite mask layer 500 is etched along the first initial mask layer 700 to form a plurality of first initial pillars 503a arranged in an array. FIG. 4 is a schematic view of a first initial pillars according to the method for fabricating the semiconductor structure provided by an embodiment of the present application. Referring to FIG. 4, the process of etching the first composite mask layer 500 along the first initial mask layer 700 is shown in FIG. 4. It may include: etching the first hard mask layer 502 along the first preliminary mask layer 700. Specifically, the first initial mask base layer 700 a and the first hard mask layer 502 are etched along the plurality of first mask patterns of the first initial mask pattern layer 700 b, so as to form a pattern on the first filling mask layer 501. A plurality of first initial pillars 503a arranged in an array. Each of the first initial pillars 503a formed includes a first hard mask layer 502 to form a first extension and a first initial mask base layer 700a to form a second extension, and the second extension is connected far from the first extension. One end of the substrate 100.

Figure 5:
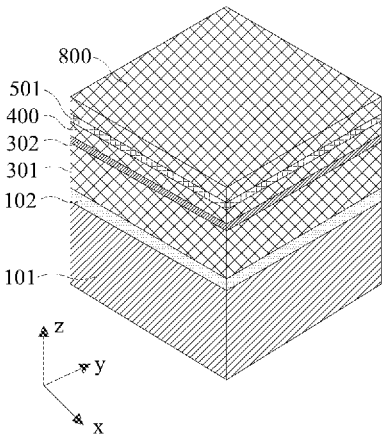
FIG. 5 is a schematic view of a sacrificial layer according to the method for fabricating the semiconductor structure provided by an embodiment of the present application.

The sacrificial layer 800 is formed on the first initial pillar 503a. FIG. 5 is a schematic view of a sacrificial layer according to the method for fabricating the semiconductor structure provided by an embodiment of the present application. Referring to FIG. 5, the step specifically includes: forming a sacrificial layer 800 on the first filling mask layer 501, the sacrificial layer 800 Covers the first initial cylinder 503a. The sacrificial layer 800 may be formed by CVD, and the material of the sacrificial layer 800 may be a spin on hardmask (SOH for short). The thickness of the sacrificial layer 800 is not limited in this embodiment, as long as it is guaranteed to cover the top of the first initial pillars 503a.

The sacrificial layer 800 covering the first initial pillars 503a is formed after the first initial pillars 503a is formed, mainly for the purpose of performing the second mask etching process and preventing the second mask etching process from affecting the formation of the first mask etching process. The first initial cylinder 503a.

Figure 6:
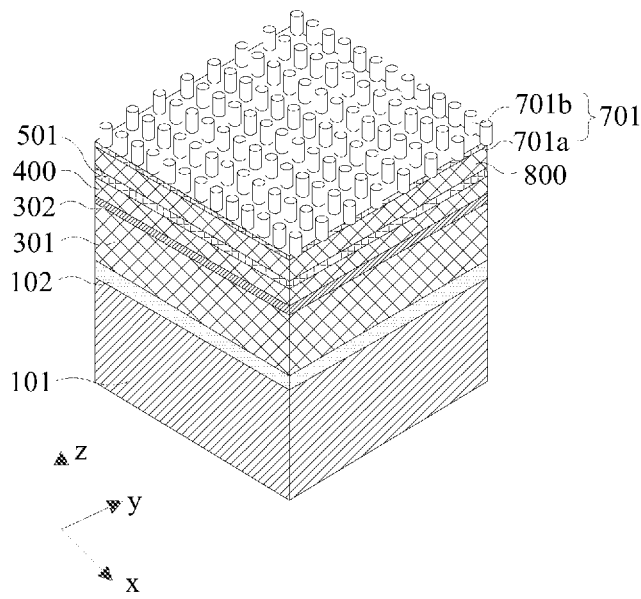
FIG. 6 is a schematic view of a second initial mask layer according to the method for fabricating the semiconductor structure provided by an embodiment of the present application.

Wherein, a second initial mask layer 701 is formed on the sacrificial layer 800. FIG. 6 is a schematic view of a second initial mask layer according to the method for fabricating the semiconductor structure provided by an embodiment of the present application. Referring to FIG. 6, the second initial mask layer 701 includes a second initial mask base layer 701 a and a second initial mask layer 701 a. The initial mask pattern layer 701b, the second initial mask pattern layer 701b is located on the side of the second initial mask base layer 701a away from the substrate 100, and the second initial mask pattern layer 701b has a plurality of second initial pillars 503b, corresponding to the plurality of second mask patterns.

Similar to the first initial mask layer 700, the second mask pattern may be a pillar with the same shape as the second initial pillar 503b, and the pillar size of the second mask pattern is the same as that of the second initial pillar 503b. There are multiple second mask patterns, and the multiple second mask patterns are arranged in an array on the second initial mask base layer 701a. Of course, the arrangement of the second mask patterns may not be limited to this, and it may be the same as the second initial pillars 503b to be formed subsequently.

Specifically, forming the second initial mask layer 701 on the sacrificial layer 800 includes: forming a second initial mask base layer 701 a on the sacrificial layer 800, and forming a second initial mask pattern layer 701 b on the second initial mask base layer 701 a. Both the second initial mask base layer 701a and the second initial mask pattern layer 701b may be formed by CVD or ALD. The material of the second initial mask base layer 701a may be the same material as the first initial mask base layer 700a, that is, silicon oxynitride. The second initial mask pattern layer 701b may be photoresist, and its material may be an organic compound sensitive to light (eg, ultraviolet light), and the material of the second initial mask pattern layer 701b may be the same as that of the first initial mask pattern layer The same material is used for the 700b. In this way, the types of materials in the semiconductor structure manufacturing process can be effectively reduced, the preparation difficulty can be reduced, and the problem of large interlayer stress between film layers of different materials can be avoided, thereby preventing the phenomenon of interlayer peeling and improving the semiconductor structure, stability.

Figure 7:
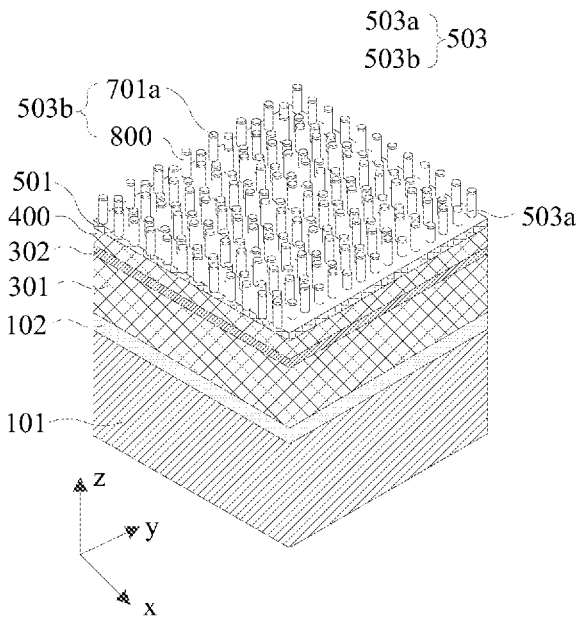
FIG. 7 is a schematic view of a second initial pillars according to the method for fabricating the semiconductor structure provided by an embodiment of the present application.

The sacrificial layer 800 is etched along the second initial mask layer 701 to form a plurality of second initial pillars 503b arranged in an array. The first initial pillars 503a and the second initial pillars 503b form the initial pillars 503. Specifically, FIG. 7 is a schematic view of a second initial pillars according to the method for fabricating the semiconductor structure provided by an embodiment of the present application. Referring to FIG. 7, etching the sacrificial layer 800 along the second initial mask layer 701 includes: The plurality of second mask patterns of the second initial mask pattern layer 701b etch the second initial mask base layer 701a and the sacrificial layer 800 to form a plurality of second mask layers arranged in an array on the first filling mask layer 501 Initial cylinder 503b.

Herein, as shown in FIG. 1 and FIG. 2, the second composite mask layer 300 includes a second hard mask layer 301 and a second filling mask layer 302, and the second hard mask layer 301 is located in the second filling mask layer 302 the side close to the substrate 100. The second hard mask layer 301 may be a spin on hardmask (SOH for short). The material of the second filling mask layer 302 includes silicon-rich silicon oxynitride (silicon-rich SiON).

It should be noted that, as shown in FIG. 4 to FIG. 7, the materials of the first hard mask layer 502, the second hard mask layer 301 and the sacrificial layer 800 can be the same, and the sacrificial layer 800 and the first initial mask base layer 700 a are made of the same material. Eclipse selection ratio is different. In the process of etching the sacrificial layer 800 along the second initial mask layer 701, the top of the first initial pillars 503 a is a second extension formed by the first initial mask base layer 700 a, and the material is silicon oxynitride. The material of the etched sacrificial layer 800 is SOH. Therefore, the materials of the sacrificial layer 800 and the first initial mask base layer 700a are different, and the etching selection ratio for the photolithography process is different. 503a has an impact. In this way, the first preliminary pillars 503a and the second preliminary pillars 503b can be collectively transferred onto the first hard mask layer 502.

Figure 8:
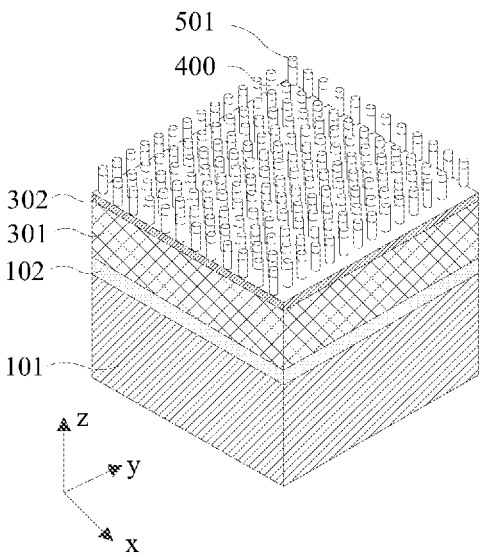
FIG. 8 is a schematic view of an etching intermediate mask layer according to the method for fabricating the semiconductor structure provided by an embodiment of the present application.
Figure 9:
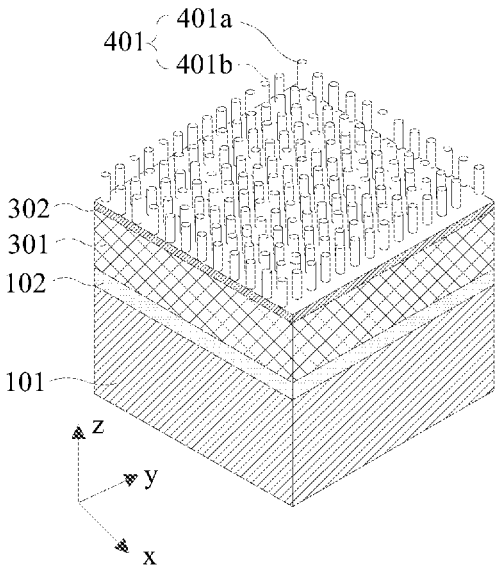
FIG. 9 is a schematic view of a transfer column according to the method for fabricating the semiconductor structure provided by an embodiment of the present application.

Specifically, the mask is etched along the initial pillars to form a plurality of transfer pillars in an array in the reticle. FIG. 8 is a schematic view of an etching intermediate mask layer according to the method for fabricating the semiconductor structure provided by an embodiment of the present application, and FIG. 9 is a schematic view of a transfer column according to the method for fabricating the semiconductor structure provided by an embodiment of the present application. Referring to FIGS. 8 and 9, etching the mask 400 along the initial pillars 503 includes: etching the mask 400 along the first initial pillars 503a to form a plurality of first transfer pillars arranged in an array body 401a: the intermediate mask layer 400 is etched along the second initial pillars body 503b to form a plurality of second transfer column bodies 401b arranged in an array: the first transfer column body 401a and the second transfer column body 401b form a transfer column body 401.

It should be noted that the intermediate mask layer 400 may be an amorphous carbon layer (ACL for short). The steps of forming the first transfer column 401a and forming the second transfer column 401b may be completed simultaneously: alternatively, the first transfer column 401a may be formed first, and then the second transfer column 401b may be formed; or, the second transfer column 401b may be formed. The first transfer column 401a is then formed after the transfer column 401b. The present embodiment does not limit the order in which the first transfer column 401a and the second transfer column 401b are formed. The top of the transfer column 401 shown in FIG. 8 is covered with a first filling mask layer 501, and the first filling mask layer 501 may be removed by wet etching, thereby forming the structure shown in FIG. 9.

In the preparation method of the semiconductor structure provided in the embodiment of the present application, the transfer column 401 is formed by performing two mask etching processes on the first composite mask layer 500, which effectively reduces the size of the transfer column 401 to ensure that the Subsequent formation of one of the spacer structures 600 has a smaller size, thereby improving the mask precision. In addition, compared with the related art, the two mask etching processes can effectively reduce the number of masks, thereby reducing the influence of light diffraction on the exposure process and improving the precision of photoetching.

Figure 24:
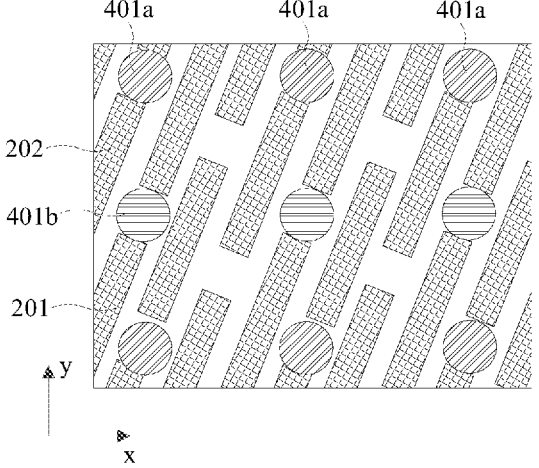
FIG. 24 is a schematic view of an active region mask and a transfer pillar of the semiconductor structure provided by an embodiment of the present application.
Figure 25:
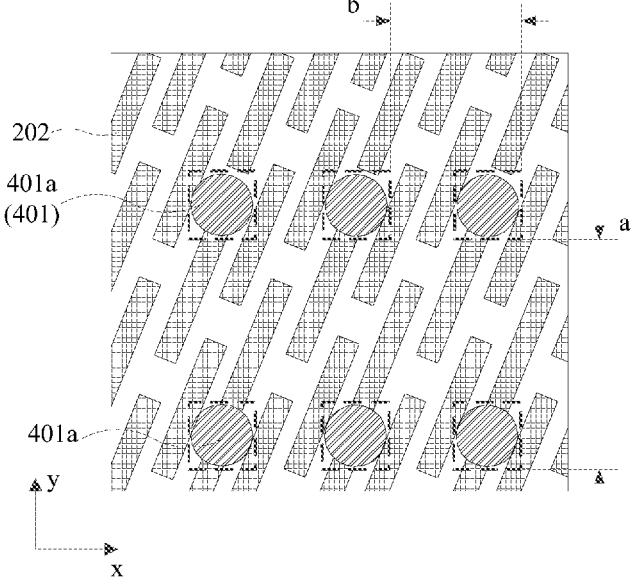
FIG. 25 is a schematic view of an active region mask and a transfer pillar of the semiconductor structure provided by an embodiment of the present application.

Specifically, the arrangement of the plurality of transfer pillars 401 can be adjusted, and the arrangement of the plurality of transfer pillars 401 in this application can include the following two:

As a first achievable arrangement of the transfer pillars 401, FIG. 24 is a schematic view of an active region mask and a transfer pillar of the semiconductor structure provided by an embodiment of the present application, and FIG. 25 is a view of an active region mask and a transfer pillar provided by the embodiment of the application. A schematic structural diagram of an active area mask and a transfer column of a semiconductor structure, as shown in FIG. 24 and FIG. 25, the plurality of transfer columns 401 include a plurality of rows of transfer columns 401 arranged at intervals along the first direction. The plurality of first transfer pillars 401a and the plurality of plurality of second transfer pillars 401b are respectively located in different rows of the plurality of rows of the plurality of transfer pillars 401.

Multiple rows of plurality of first transfer pillars 401a and multiple rows of plurality of second transfer pillars 401b are alternately arranged along the first direction. The columns 401b are arranged in a one-to-one correspondence.

It should be noted that, the first direction may be the direction shown by y in FIG. 24 and FIG. 25, and the multiple plurality of first transfer pillars 401 a located in the same row are one-to-one with the multiple plurality of second transfer pillars 401b located in the adjacent row. Correspondingly, that is, one plurality of first transfer pillars 401 a located in the same row is set correspondingly to one plurality of second transfer pillars 401b located in an adjacent row.

The pitch between the plurality of first transfer pillars 401a in two adjacent rows is the same as the pitch between the plurality of second transfer pillars 401b in two adjacent rows, and both are the first pitch. FIG. 25 only shows that the pitch between the plurality of first transfer pillars 401a in two adjacent rows is a, and the pitch between the plurality of second transfer pillars 401b in two adjacent rows is the same. The value range of the first pitch a may be 130-150 nm. In this embodiment, the first pitch a maybe 135 nm, 139.2 nm, 140 nm or 145 nm.

The pitch between two adjacent plurality of first transfer pillars 401a located in the same row may be the part shown in b in FIG. 25. The pitch between two adjacent plurality of second transfer pillars 401b located in the same row is the same. The pitch between two adjacent plurality of first transfer pillars 401a located in the same row is the same as the pitch between two adjacent plurality of second transfer pillars 401b located in the same row, and both are second pitches. The value range of the second pitch b may be 60-100 nm. In this embodiment, the second pitch b may be 80 nm, 85 nm, 89 nm, 90 nm or 95 nm. The first pitch a may be greater than the second pitch b, so as to ensure that there is enough space between two adjacent rows of the plurality of first transfer pillars 401a for accommodating one row of the plurality of second transfer pillars 401b. Similarly, it is also possible to It is ensured that there is enough space between the plurality of second transfer pillars 401b of two adjacent rows for accommodating the plurality of first transfer pillars 401a of one row.

Figure 26:
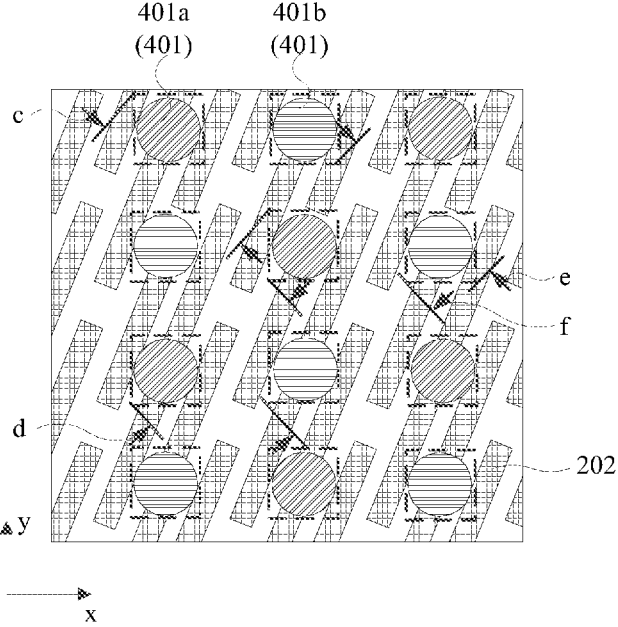
FIG. 26 is a schematic view of another active region mask and transfer pillar of the semiconductor structure provided by an embodiment of the present application.

FIG. 26 is a schematic view of another active region mask and transfer pillar of the semiconductor structure provided by an embodiment of the present application. Referring to FIG. 26, as a second achievable arrangement of the transfer pillars 401, The plurality of plurality of transfer pillars 401 include a plurality of rows of plurality of transfer pillars 401 spaced along the first direction, and the plurality of plurality of first transfer pillars 401a and the plurality of plurality of second transfer pillars 401b are located in the same row of the plurality of rows of plurality of transfer pillars 401, and are arranged alternately and at intervals along the second direction.

The plurality of first transfer pillars 401a located in the same row and the plurality of first transfer pillars 401a of the adjacent rows are staggered from each other, and the plurality of second transfer pillars 401b located in the same row and the plurality of second transfer pillars 401b of the adjacent rows are staggered from each other: the first direction and the second direction cross each other.

It should be noted that the first direction may be the direction shown by y in FIG. 26, and the y direction is the same as the y direction in FIG. 24. The second direction may be the direction shown by x in FIG. 26. Among the plurality of transfer pillars 401 in two adjacent rows, a plurality of first transfer pillars 401a in the same row corresponds to a plurality of second transfer pillars 401b in an adjacent row.

Wherein, for example, in every three adjacent rows of plurality of transfer pillars 401, the pitch between the plurality of first transfer pillars 401a located in the first row and the plurality of first transfer pillars 401a located in the second row and staggered from each other is the third pitch, the pitch between the plurality of first transfer pillars 401a in the second row and the plurality of first transfer pillars 401a in the third row and staggered from each other is the fourth pitch, and the third pitch is equal to the fourth pitch.

It should be noted that, among the four rows of plurality of transfer pillars shown in FIG. 26, the first three rows of plurality of transfer pillars 401 along the −y direction are the three adjacent rows of plurality of transfer pillars 401. The third pitch may be the portion shown in c in FIG. 26, and the fourth pitch may be the portion shown in d. The numerical ranges of the third pitch c and the fourth pitch d may both be 90-120 nm. In this embodiment, the values of the third pitch c and the fourth pitch d may be 95 nm, 100 nm, 106.2 nm or 110 nm.

Exemplarily, in every three adjacent rows of plurality of transfer pillars 401, the pitch between the plurality of second transfer pillars 401b located in the first row and the plurality of second transfer pillars 401b located in the second row and staggered from each other is the first Five pitches, the pitch between the plurality of second transfer pillars 401b in the second row and the plurality of second transfer pillars 401b in the third row and staggered from each other is the sixth pitch, and the fifth pitch is equal to the sixth pitch.

It should be noted that the fifth pitch may be the part shown in e in FIG. 26, and the sixth pitch may be the part shown in f in FIG. 26. The numerical ranges of the fifth pitch e and the sixth pitch f may both be 90-120 nm. In this embodiment, the values of the fifth pitch e and the sixth pitch f may be 95 nm, 100 nm, 106.2 nm or 110 nm.

In this way, the regularity of the arrangement of the transfer pillars 401 can be improved, and it is ensured that the active regions 103 formed subsequently can also be regularly arranged in the substrate 100. It can be realized that the third pitch c and the fifth pitch e may be equal or unequal, which is not limited in this embodiment.

In this embodiment, the "pitch" refers to the shortest straight-line distance between the positions of the two structural members on the same side. For example, the pitch between the plurality of first transfer pillars 401a in two adjacent rows is the second in the adjacent two rows. The shortest linear distance between a plurality of transfer pillars 401a. In addition, since the cross section of the plurality of transfer pillars 401 is circular in this embodiment, in order to ensure the accuracy of calculating the pitch, in FIG. 25 and FIG. 26, the outside of each plurality of transfer pillars 401 is marked with a dotted frame, The start and end points of the dimensioning of the pitch are also the same corresponding positions of the dotted boxes of different plurality of transfer pillars 401. For example, the starting point marked with the third pitch c in FIG. 26 is the upper left corner of the dashed frame of the plurality of first transfer pillars 401a in the first row, and the end point marked with the third pitch c is the plurality of first transfer pillars located in the second row The upper left corner of the dashed box of body 401a.

The above two arrangement manners of the transfer pillars 401 are only feasible implementation manners provided in this embodiment, and the arrangement density of the transfer pillars 401 can be increased, thereby improving the etching precision.

Figure 12:
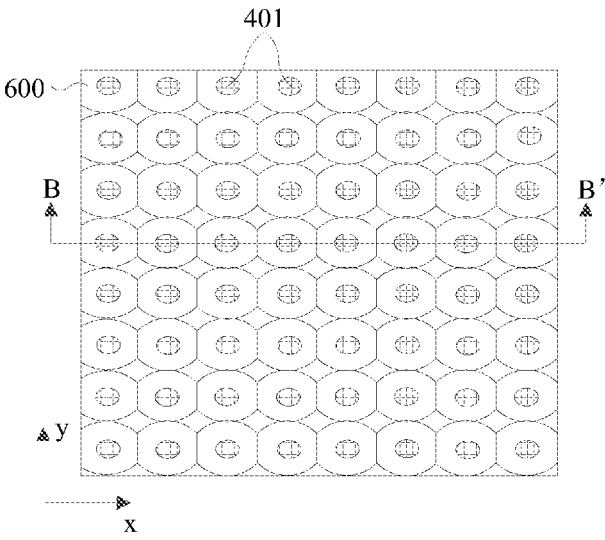
FIG. 12 is a schematic view of a spacer structure according to the method for fabricating the semiconductor structure provided by an embodiment of the present application.
Figure 13:
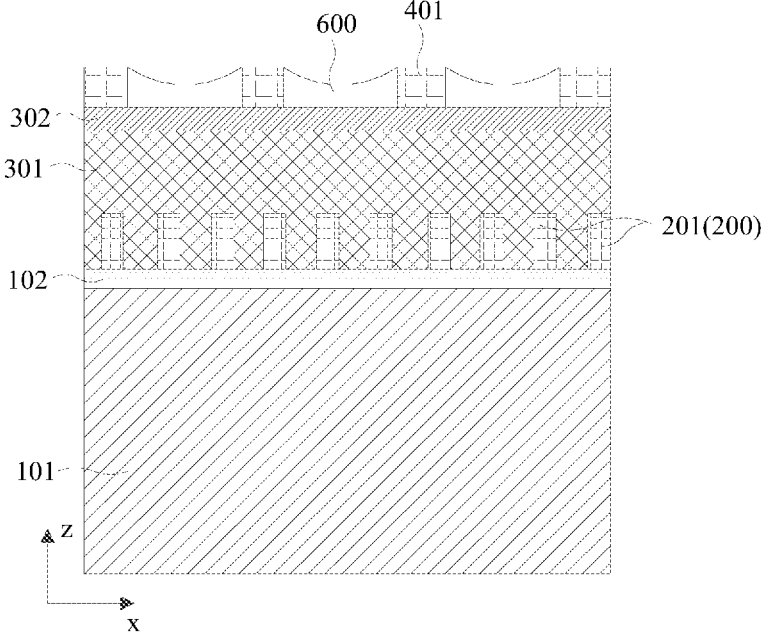
FIG. 13 is a cross-sectional view at B-B' in FIG. 12.

S300: forming a spacer structure on the outside of the transfer column, some of one of the spacer structures s arranged adjacent to each other form a first etch hole. FIG. 10 is a schematic view of an initial spacer structure according to the method for fabricating the semiconductor structure provided by an embodiment of the present application. FIG. 12 is a schematic view of a spacer structure according to the method for fabricating the semiconductor structure provided by an embodiment of the present application, and FIG. 13 is a cross-sectional view at B-B' in FIG. 12. Referring to FIG. 10 to FIG. 13, one of the spacer structures 600 may be formed by ALD, and the material of one of the spacer structures 600 may be silicon oxide. The thickness adjustment of one of the spacer structures 600 can be accomplished by adjusting the thickness of the silicon oxide layer deposited during the ALD process.

The larger the thickness of the silicon oxide deposition is, the smaller the diameter of the first etch holes 601 surrounded by adjacent spacer structures 600 is.

Specifically, one of the spacer structures 600 is formed on the outside of the transfer column 401, and at least part of one of the spacer structures s 600 arranged adjacent to each other to enclose the first etch hole 601 include:

An initial spacer structure 603 is formed, and the initial spacer structure 603 covers the plurality of transfer pillars 401, wherein the initial spacer structures 603 between the adjacently arranged plurality of transfer pillars 401 form a void structure, see FIGS. 10 and 11. It should be noted that the void structure formed between the adjacently arranged plurality of transfer pillars 401 may be surrounded by the initial spacer structure 603 between every four adjacently arranged plurality of transfer pillars 401. Along the directions of x and y in FIG. 11, the thickness of the initial spacer structure 603 between two adjacent plurality of transfer pillars 401 is relatively large and is in a connected state, and the distance between the two adjacent plurality of transfer pillars 401 along the x and y directions is relatively large. The height of the initial spacer structure 603 in between is greater than the height of one of the spacer structures 603 at the bottom of the void structure. Exemplarily, the height of the initial spacer structures 603 located above the transfer pillars 401 is greater than that of the initial spacer structures 603 located on the sidewalls of the transfer pillars 401.

Continuing to refer to FIGS. 12 and 13, the initial spacer structures 603 at the top of the plurality of transfer pillars 401 and at the bottom of the void structure are removed to form spacer structures 600 on the exterior of the plurality of transfer pillars 401, at least partially adjacently arranged spacers The structure 600 encloses the first etch hole 601. Specifically, at least part of the adjacently arranged spacer structures 600 enclosing the first etch holes 601 includes: at least four spacer structures 600 are arranged around adjacent ones, and the first etch holes 601 are formed in four adjacently arranged spacer structures 601, within the area enclosed by one of the spacer structures s 600. Removing the initial spacer structures 603 at the tops of the transfer pillars 401 and the bottoms of the void structures can expose the second fill mask layer 302 at the bottoms of the initial spacers 603. The cross-sectional shape of one of the spacer structures s 600 may be circular, elliptical or elliptical-like, and every adjacent four spacer structures 600 are arranged around each other, and the cross-sectional shape of the surrounding area may be similar to a rhombus. Of course, the surrounding area may be the first etch hole 601, or the first etch hole 601 may be located in the surrounding area, and the first etch hole is formed by etching one of the spacer structures 600 located in the surrounding area 601.

S400: removing the transfer pillar to form a second etch hole in one of the spacer structures, and the first etch hole and the second etch hole form an etching hole. The removal of the transfer pillars 401 may be accomplished by wet etching, thereby exposing the second filling mask layer 302 located in one of the spacer structures 600 and located at the bottom of the transfer pillars 401.

Figure 14:
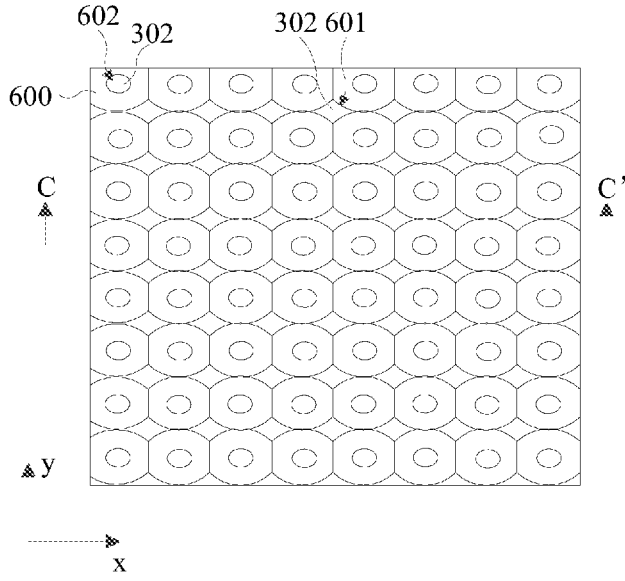
FIG. 14 is a top view of etch holes according to the method for fabricating the semiconductor structure provided by an embodiment of the present application.
Figure 15:
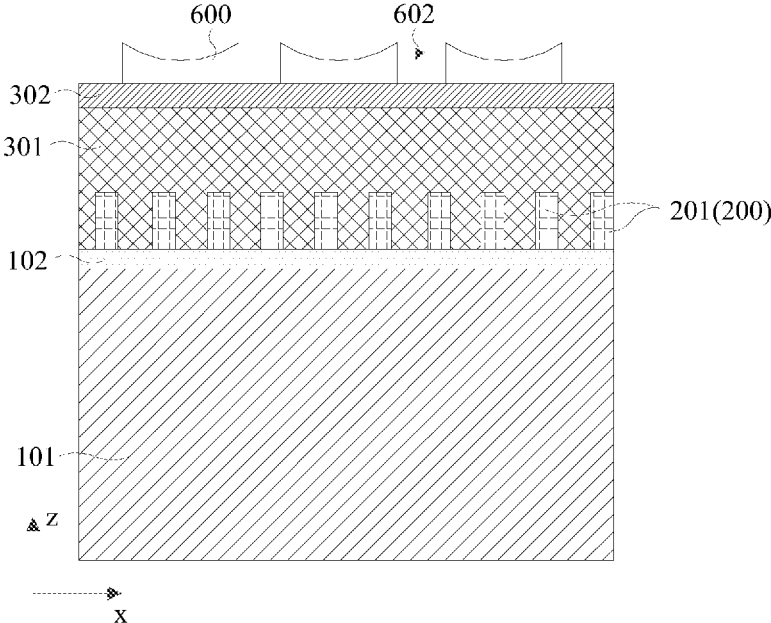
FIG. 15 is a cross-sectional view at C-C' in FIG. 14.

It should be noted that FIG. 14 is a top view of etch holes according to the method for fabricating the semiconductor structure provided by an embodiment of the present application, and FIG. 15 is a cross-sectional view at C-C' in FIG. 14. The structure of removing the transfer column 401 may be shown in FIG. 14 and FIG. 15. The step of removing the transfer column 401 may be after removing the initial spacer structure 603 located at the top of the transfer column 401 and before removing the initial spacer structure 603 located at the bottom of the void structure, or after the above two steps. The example does not limit the sequence of steps of removing the plurality of transfer pillars 401.

S500: etching the active lines along the etching holes to form a plurality of discrete active area masks. This step specifically includes etching the second composite mask layer 300 and the active line 201 along the etching hole.

The etching of the second composite mask layer 300 along the etching hole includes: etching the second filling mask layer 302 along the etching hole: and etching the second hard mask layer 301 along the etching hole.

Figure 16:
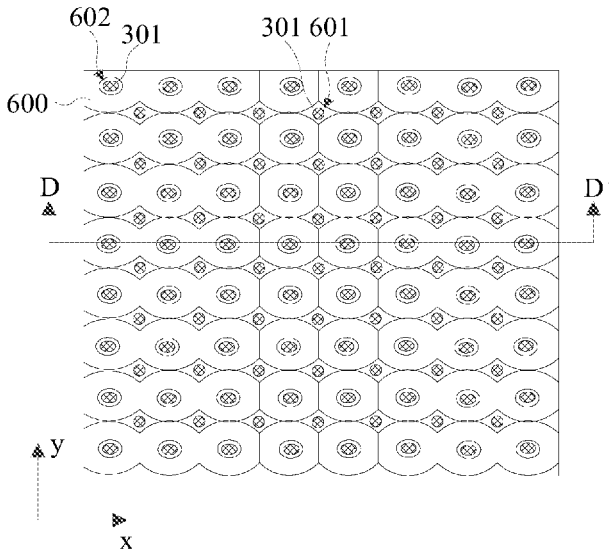
FIG. 16 is a top view of the second filling mask layer along the etch holes according to the method for fabricating the semiconductor structure provided by an embodiment of the present application.
Figure 17:
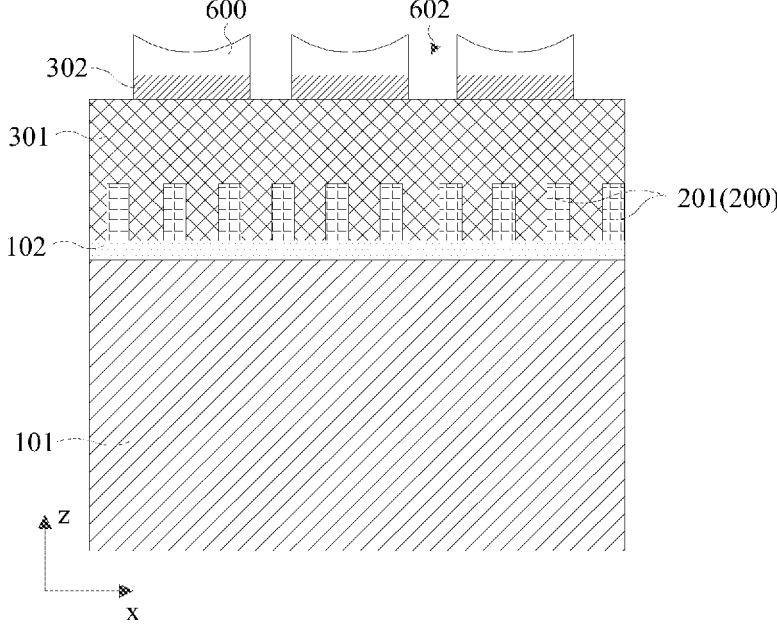
FIG. 17 is a cross-sectional view at D-D' in FIG. 16.

FIG. 16 is a top view of the second filling mask layer along the etch holes according to the method for fabricating the semiconductor structure provided by an embodiment of the present application, and FIG. 17 is a cross-sectional view at D-D' in FIG. 16. Referring to FIG. 16 and FIG. As shown in 17, the second filling mask layer 302 is etched along the etching hole to expose the second hard mask layer 301 located at the bottom of the second filling mask layer 302 in the etching hole.

Figure 18:
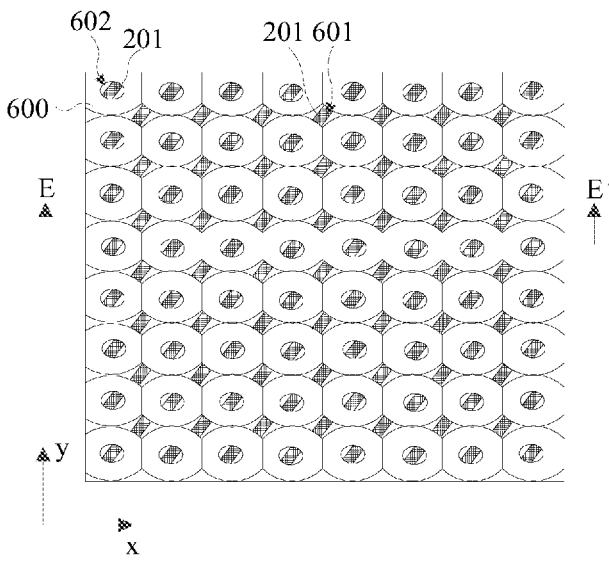
FIG. 18 is a top view of the second hard mask layer along the etch holes according to the method for fabricating the semiconductor structure provided by an embodiment of the present application.
Figure 19:
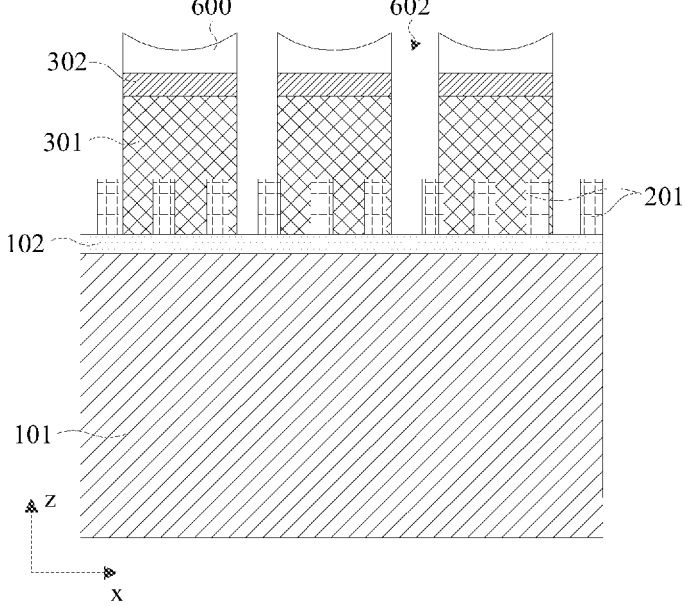
FIG. 19 is a cross-sectional view at E-E' in FIG. 18.

FIG. 18 is a top view of the second hard mask layer along the etch holes according to the method for fabricating the semiconductor structure provided by an embodiment of the present application, and FIG. 19 is a cross-sectional view at E-E' in FIG. 18. Referring to FIG. 18 and FIG. 19, the second hard mask layer 301 is etched along the etching hole to expose the active line 201 covered by the second hard mask layer 301 in the etching hole.

Figure 20:
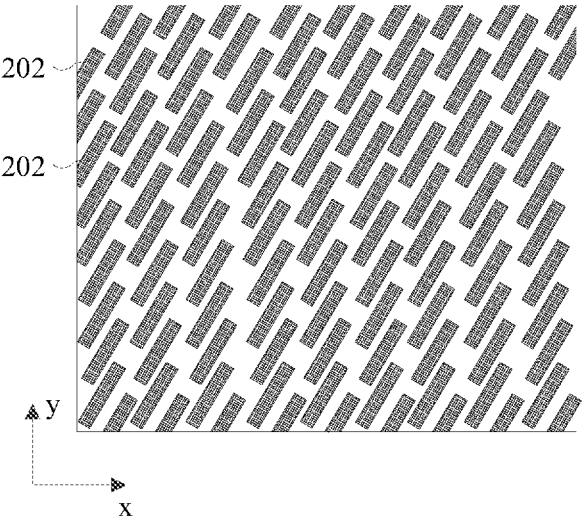
FIG. 20 is a top view of an active region mask according to the method for fabricating the semiconductor structure provided by an embodiment of the present application.
Figure 21:
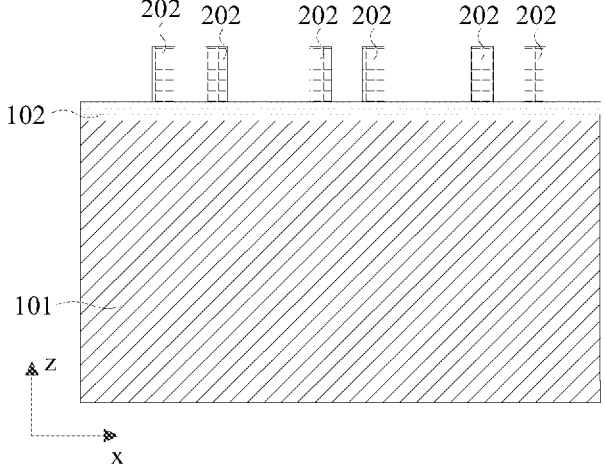
FIG. 21 is a cross-sectional view of an active region mask according to the method for fabricating the semiconductor structure provided by an embodiment of the present application.

FIG. 20 is a top view of an active region mask according to the method for fabricating the semiconductor structure provided by an embodiment of the present application, and FIG. 21 is a cross-sectional view of an active region mask according to the method for fabricating the semiconductor structure provided by an embodiment of the present application. In FIGS. 20 and 21, specifically, etching the active line 201 along the etching hole include the following steps:

The second composite mask layer 300 and the active line 201 are etched using the etching hole as a mask until a cut-off point is formed in the active line 201, and the cut-off point is located at the orthographic projection position of the etching hole on the active line 201. The cut-off point is etched to cut the active line 201 to form a plurality of discrete active region masks 202. Exemplarily, the schematic structural diagram of the active region mask of the semiconductor structure provided by the embodiments of the present application can be referred to as shown in FIG. 20.

After the active region mask 202 is formed, the method further includes: S600: etching the substrate along the active region mask to form a plurality of discrete active regions. The structure thereof can be referred to as shown in FIG. 22, wherein the etching depth of the active region 103 can be adjusted according to actual needs, and the depth of the active region 103 is not limited in this embodiment.

After the active regions 103 are formed, the method further includes: doping treatment of each active region 103 to form a source region, a channel region and a drain region in each active region 103, and the channel region is located in the source region and the drain region, between the drain regions. The doping process may be implemented by doping ions into the active region 103, and the doping ions may include but not limited to phosphorus. The doping concentration of the doping ions can be adjusted as required, so as to form a heavily doped region with a higher doping concentration and a lightly doped region with a lower doping concentration to meet different electron transport functions.

Referring to FIGS. 1 and 2, in this embodiment, the substrate 100 includes a substrate body 101 and a transition layer 102, and the transition layer 102 is located between the substrate body 101 and the initial semiconductor layer 200; along the active region mask 202 Etching the substrate 100 includes: etching the transition layer 102 and the substrate body 101 along the active region mask 202 to form a plurality of discrete active regions 103. It should be noted that the substrate body 101 may be silicon, and the transition layer 102 may be silicon oxide. The transition layer 102 made of silicon oxide is disposed on the substrate body 101 made of silicon, which can effectively reduce the stress of the substrate body 101 and ensure the stable arrangement of subsequent structural layers.

In this embodiment of the present application, a spacer structure 600 is formed outside the transfer column 401, the adjacently arranged spacer structures 600 form a first etch hole 601, and a second etch hole 602 is formed in one of the spacer structures 600. The active line 201 is etched through the etching hole 601 and the second etch hole 602 to form an active region mask 202. In this way, one of the spacer structures 600 can be used to replace the third photolithography-etching process in the related art, so as to avoid the problem of low imaging resolution of the mask caused by the diffraction effect of light. Therefore, using the above-mentioned active region mask 202 to etch the substrate 100 to form discrete active regions 103 can avoid the problem of poor etching accuracy caused by unclear mask images in the related art. The difficulty of fabricating the active region 103 is effectively reduced, the LCDU of the active region 103 is improved, and the performance of the semiconductor structure is optimized.

Embodiments of the present application further provide a memory including the above-mentioned semiconductor structure. The memory of this embodiment may include, for example. Dynamic Random Access Memory (DRAM). Static Random Access Memory (SRAM), flash memory, and Electrically Erasable Programmable Read-Only Memory (EEPROM). Phase Change Random Access Memory (PRAM), or Magneto-resistive Random Access Memory (MRAM). The embodiments of the present application take a DRAM memory device as an example for description.

A transistor and a capacitor may be formed on the substrate 100 of the semiconductor structure. The gate of the transistor is connected to a word line (WL for short), the drain is connected to the bit line, and the source is connected to the capacitor. The source of the transistor may be electrically connected to the source region of the active region 103 of the semiconductor structure, and the drain of the transistor may be electrically connected to the drain region of the active region 103 of the semiconductor structure. The gate of the transistor may be disposed corresponding to the channel region of the active region 103, and a gate insulating layer may be disposed between the two.

During the use of the memory, the voltage signal on the word line can control the opening or closing of the transistor, and then read the data information stored in the capacitor through the bit line, or write the data information into the capacitor through the bit line for storage. The word line is connected to a word line driver through a local interconnect contact (LICON for short) located in the peripheral region of the memory cell, so that the word line driver can input a voltage signal to the word line.

Based on the high LCDU of the active region 103 in the above-mentioned semiconductor structure, the stability of the electrical connection between the transistor and the active region 103 can be ensured, thereby optimizing the structural stability and storage performance of the memory. Other technical features in the memory of this embodiment are the same as those of the above-mentioned embodiments of the semiconductor structure and the method for fabricating the semiconductor structure, and can achieve the same technical effect, which will not be repeated here.

In the above description, it should be understood that the terms "installed", "connected" and "connected" should be construed in a broad sense, unless otherwise expressly specified and limited. The connection can be the internal communication of the two elements or the interaction relationship of the two elements. For those of ordinary skill in the art, the specific meanings of the above terms in this application can be understood according to specific situations. The orientation or positional relationship indicated by the terms "upper", "lower", "front", "rear", "vertical", "horizontal", "top", "bottom", "inner", "outer", etc. is based on the orientation or positional relationship shown in the drawings is only for the convenience of describing the present application and simplifying the description, rather than indicating or implying that the referred device or element must have a specific orientation, be constructed and operated in a specific orientation, and therefore should not be understood as LIMITATIONS ON THIS APPLICATION. In the description of this application. "plurality" means two or more, unless it is precisely and specifically specified otherwise.

The terms "first", "second", "third", "fourth", etc. (if any) in the description and claims of this application and the above-mentioned drawings are used to distinguish similar objects and are not necessarily used to describe a specific order or sequence. It is to be understood that the data so used may be interchanged under appropriate circumstances such that the embodiments of the application described herein can, for example, be practiced in sequences other than those illustrated or described herein. Furthermore, the terms "comprising" and "having" and any variations thereof, are intended to cover non-exclusive inclusion, for example, a process, method, system, product or device comprising a series of steps or units is not necessarily limited to those expressly listed Rather, those steps or units may include other steps or units not expressly listed or inherent to these processes, methods, products or devices.

Finally, it should be noted that each of the above embodiments is only used to illustrate the technical solutions of the present application, but not to limit them; although the present application has been described in detail with reference to each of the foregoing embodiments, those of ordinary skill in the art should understand that: it is still possible to modify the technical solutions recorded in each of the foregoing embodiments, or to perform equivalent replacements on some or all of the technical features; and these modifications or replacements do not make the essence of the corresponding technical solutions deviate from each implementation of the application scope of technical solutions.

The invention claimed is:

1. A method of fabricating a semiconductor structure, comprising:

providing a substrate;

forming a stack layer on the substrate, wherein the stack layer comprises an initial semiconductor layer, a second composite mask layer, an intermediate mask layer, and a first composite mask layer, wherein all are stacked in sequence; forming a plurality of active lines at intervals and a plurality of transfer pillars in the stack layer, comprising:

sequentially forming the initial semiconductor layer, the second composite mask layer, the intermediate mask layer and the first composite mask layer on the substrate, wherein the initial semiconductor layer comprises the plurality of active lines arranged at intervals;

performing two mask etching processes on the first composite mask layer to form a plurality of initial pillars arranged in an array in the first composite mask layer, comprising:

forming a first initial mask layer on the first composite mask layer;

etching the first composite mask layer along the first initial mask layer to form a plurality of first initial pillars arranged in an array;

forming a sacrificial layer on the plurality of first initial pillars;

forming a second initial mask layer on the sacrificial layer;

etching the sacrificial layer along the second initial mask layer to form a plurality of second initial pillars arranged in an array; and forming initial pillars out of the plurality of first initial pillars and the plurality of second initial pillars; and etching the intermediate mask layer along the plurality of initial pillars to form the plurality of transfer pillars in the intermediate mask layer;

forming spacer structures outside the plurality of transfer pillars, and configuring at least a portion of the spacer structures adjacent to each other to form a first etch hole;

removing the plurality of transfer pillars to form a second etch hole in one of the spacer structures, wherein the first etch hole and the second etch hole form an etching hole;

etching the active lines along the etching hole to form a plurality of discrete active area masks; and etching the substrate along the plurality of discrete active area masks to form a plurality of discrete active regions.

2. The method for fabricating the semiconductor structure according to claim 1, wherein forming the spacer structures outside the plurality of transfer pillars and configuring at least the portion of the spacer structures adjacent to each other to form the first etch hole comprises:

forming an initial spacer structure, wherein the initial spacer structure covers one of the plurality of transfer pillars, wherein the initial spacer structure between two adjacently arranged plurality of transfer pillars encloses a void structure; and removing the initial spacer structure from a top of said one of the plurality of transfer pillars and from a bottom of the void structure, so as to form the spacer structures outside of the plurality of transfer pillars, wherein at least a portion of the spacer structures adjacent to each other is configured to surround the first etched hole.

3. The method for fabricating the semiconductor structure according to claim 1, wherein at least a portion of the spacer structures adjacent to each other is configured to surround the first etched hole comprises:

at least four of the spacer structures are configured to be adjacent to each other, wherein the first etch hole is arranged in an area surrounded by the four of the spacer structures adjacent to each other.

4. The method for fabricating the semiconductor structure according to claim 1, wherein etching the intermediate mask layer along the plurality of initial pillars comprises:

etching the intermediate mask layer along the plurality of first initial pillars to form a plurality of first transfer pillars arranged in an array;

etching the intermediate mask layer along the plurality of second initial pillars to form a plurality of second transfer columns arranged in an array; and forming the plurality of transfer pillars out of the plurality of first transfer pillars and the plurality of second transfer pillars.

5. The method for fabricating the semiconductor structure according to claim 4, wherein the plurality of transfer pillars comprises rows of the transfer pillars arranged along a first direction, wherein the plurality of first transfer pillars and the plurality of second transfer pillars are respectively located in different rows of the plurality of transfer pillars; and wherein multiple rows of the plurality of first transfer pillars and multiple rows of the plurality of second transfer pillars are alternately arranged along the first direction, and multiple rows of the plurality of first transfer pillars in a same row and the plurality of second transfer pillars in adjacent rows are arranged in a one-to-one correspondence.

6. The method for fabricating the semiconductor structure according to claim 4, wherein the plurality of transfer pillars comprises rows of the plurality of transfer pillars arranged along a first direction, and wherein the plurality of the first transfer pillars and the plurality of the plurality of second transfer pillars located in a same row of the plurality of transfer pillars are arranged alternately at intervals along the second direction;

wherein the plurality of first transfer pillars in a same row and the plurality of first transfer pillars in an adjacent row are staggered from each other, and wherein the plurality of second transfer pillars in a same row and the plurality of second transfer pillars in an adjacent row are staggered from each other; and wherein the first direction and the second direction intersect each other.

7. The method for fabricating the semiconductor structure according to claim 5, wherein a pitch between two adjacent ones of the plurality of first transfer pillars and a pitch between two adjacent ones of the plurality of the second transfer pillars are equal, as a first pitch;

wherein a pitch between two adjacent ones of the plurality of first transfer pillars in a same row is equal to a pitch between two adjacent ones of the plurality of second transfer pillars in a same row, as a second pitch; and wherein the first pitch is greater than the second pitch.

8. The method for fabricating the semiconductor structure according to claim 6, wherein, in every three adjacent rows of the plurality of transfer pillars, ones of the plurality of first transfer pillars located in the first row and ones of the plurality of first transfer pillars located in the second row are set staggered;

wherein a pitch between two staggered ones of the plurality of first transfer pillars is a third pitch, and wherein a pitch between one of the plurality of first transfer pillars located in the second row and one of the plurality of first transfer pillars located in the third row are set staggered from each other is a fourth pitch; and wherein the third pitch is equal to the fourth pitch.

9. The method for fabricating the semiconductor structure according to claim 1, wherein etching the plurality of active lines along the etching holes comprises:

using the etching holes as a mask to etch the second composite mask layer and the plurality of active lines, until a cut-off point is formed in the plurality of active lines, wherein the cut-off point is located in one of the etching holes in an orthographic position on one of the plurality of active lines; and etching the cut point to cut the plurality of active lines to form the plurality of discrete active area masks.

10. The method for fabricating the semiconductor structure according to claim 1, wherein after forming the plurality of active regions, further comprising: doping each of the plurality of active regions to form a source region, a channel region and a drain region, wherein a channel region is located between the source region and the drain region.

11. The method for fabricating the semiconductor structure according to claim 4, wherein the first composite mask layer comprises a first hard mask layer and a first filling mask layer, wherein the first hard mask layer is located on the a side of the first filling mask layer away from the substrate;

wherein the method further comprises:

forming a first initial mask layer on the first composite mask layer, wherein the first initial mask layer is on the first hard mask layer;

etching the first composite mask layer along the first initial mask layer, comprising: etching the first hard mask layer along the first initial mask layer to fill in the first mask layer, and forming the plurality of first initial pillars in an array in the first filling mask layer; and forming the sacrificial layer on the plurality of first initial pillars comprises: forming the sacrificial layer on the first filling mask layer, wherein the sacrificial layer covers the plurality of first initial pillars.

12. The method for fabricating the semiconductor structure according to claim 11, wherein the first initial mask layer comprises a first initial mask layer and a first initial mask pattern layer, wherein the first initial mask pattern layer is on a side of the first initial mask layer away from the substrate, wherein the first initial mask pattern layer comprises a plurality of first mask patterns in a one-to-one correspondence to the plurality of first initial pillars;

wherein the method further comprises:

forming the first initial mask layer on the first hard mask layer comprising: forming the first initial mask layer on the first hard mask layer, to form the first initial mask pattern layer; and etching the first hard mask layer along the first initial mask layer comprising: etching the first initial mask layer along the plurality of first mask patterns of the first initial mask pattern layer and the first hard mask layer to form the plurality of first initial pillars arranged in the array in the first filling mask layer.

13. The method for fabricating the semiconductor structure according to claim 11, wherein the second initial mask layer comprises a second initial mask layer and a second initial mask pattern layer, wherein the second initial mask pattern layer is on a side of the second initial mask layer away from the substrate, wherein the second initial mask pattern layer comprises a plurality of second mask patterns in one-to-one correspondence to the plurality of second initial pillars;

wherein forming the second initial mask layer on the sacrificial layer comprises: forming the second initial mask layer on the sacrificial layer, and forming the second initial mask patterns on the second initial mask layer; and wherein etching the sacrificial layer along the second initial mask layer comprises: etching the second initial mask layer and the second initial mask layer along the plurality of second mask patterns of the second initial mask pattern layer and the sacrificial layer to form the plurality of the second initial pillars arranged in an array in the first filling mask layer.

14. The method for fabricating the semiconductor structure according to claim 4, wherein the second composite mask layer comprises a second hard mask layer and a second filling mask layer, and the second hard mask layer is located on the a side of the second filling mask layer closer to the substrate;

wherein etching the second composite mask layer along the etching holes comprises: etching the second filling mask layer along the etching holes; and etching the second hard mask layer along the etching holes.

15. The method for fabricating the semiconductor structure according to claim 1, wherein the substrate comprises a substrate body and a transition layer, wherein the transition layer is located between the substrate body and the initial semiconductor layer; and wherein etching the substrate along the plurality of discrete active area masks comprises:

etching the transition layer and the substrate body along the plurality of discrete active area masks to form the plurality of discrete active regions.

16. A semiconductor structure, comprising an active region, wherein the active region is fabricated by the method for fabricating the semiconductor structure according to claim 1.

17. A memory device comprising the semiconductor structure of claim 16.

\* \* \* \* \*